United States Patent [19]
Shibata et al.

[11] Patent Number: 5,877,937
[45] Date of Patent: *Mar. 2, 1999

[54] ENCAPSULATED SEMICONDUCTOR DEVICE AND ELECTRONIC CIRCUIT BOARD MOUNTING SAME

[75] Inventors: Kazutaka Shibata; Tomoharu Horio, both of Kyoto, Japan

[73] Assignee: Rohm Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 773,699

[22] Filed: Dec. 27, 1996

[30] Foreign Application Priority Data

Dec. 28, 1995 [JP] Japan .................................... 7-342337

[51] Int. Cl.$^6$ ...................................................... H05K 7/20
[52] U.S. Cl. ...................... 361/719; 174/16.3; 257/692; 361/773
[58] Field of Search .................... 228/180.21; 438/15, 438/107; 165/80.3, 185; 174/16.3, 52.4, 261; 257/675, 692, 706, 707, 713; 361/704–707, 709–712, 717–719, 723, 764, 773, 813

[56] References Cited

U.S. PATENT DOCUMENTS

| | | | |
|---|---|---|---|
| 4,809,135 | 2/1989 | Yerman | 361/404 |
| 4,855,867 | 8/1989 | Gadzik | 361/306 |
| 4,920,074 | 4/1990 | Shimizu | 437/211 |
| 5,703,752 | 12/1997 | Woo | 361/704 |

FOREIGN PATENT DOCUMENTS

| | | | |
|---|---|---|---|
| 35-2072166 | 6/1977 | Japan | 361/719 |
| 61-150356 | 12/1984 | Japan . | |
| 1-258455 | 4/1988 | Japan . | |

*Primary Examiner*—Gerald Tolin
*Attorney, Agent, or Firm*—Majestic, Parsons, Siebert & Hsue P.C.

[57] ABSTRACT

A semiconductor device has a resin package containing a semiconductor chip, lead pins electrically connected to the chip, and a heat radiating plate for transmitting heat of the semiconductor chip to the exterior. The lead pins and the heat radiating plate protrude from a side wall of the resin package. The lead pins each have a planar end part attached by soldering to a wiring pattern on a circuit board. The heat radiating plate has a planar attachment part which is attached by soldering to a heat radiating pattern on the circuit board. The planar attachment part of the heat radiating plate is non-rectangular and is shaped such that when it is attached to a solder-coated area on a heat radiating pattern formed on a circuit board, the melted solder is more effectively prevented from flowing out.

6 Claims, 6 Drawing Sheets

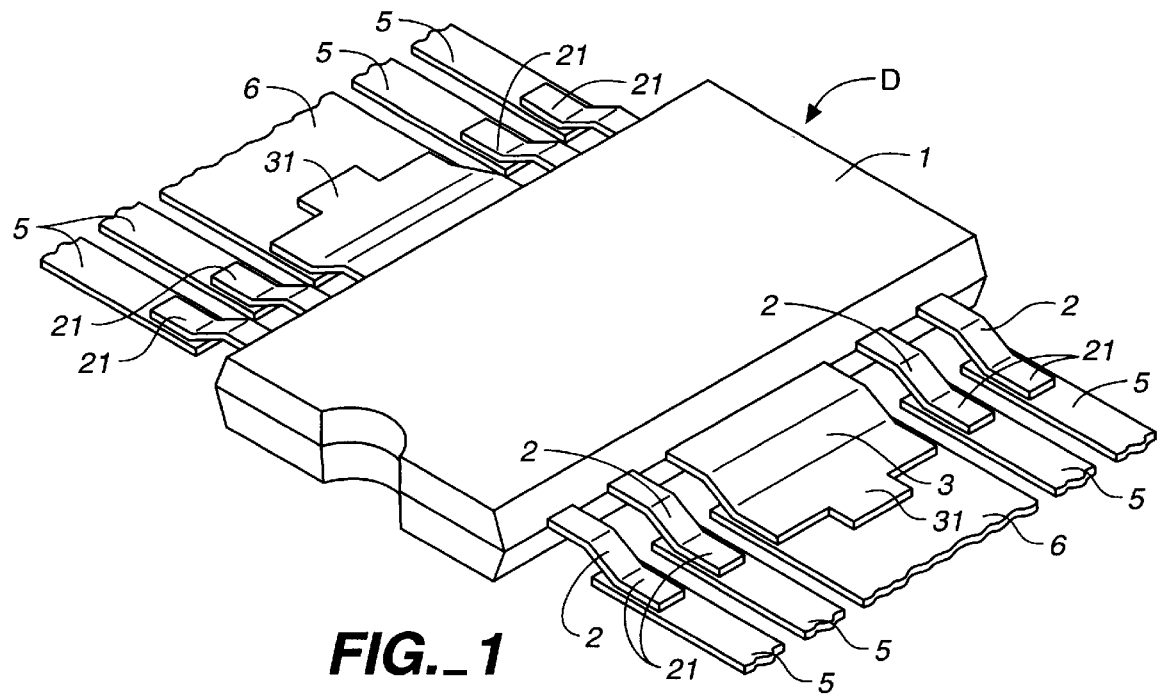
FIG._1
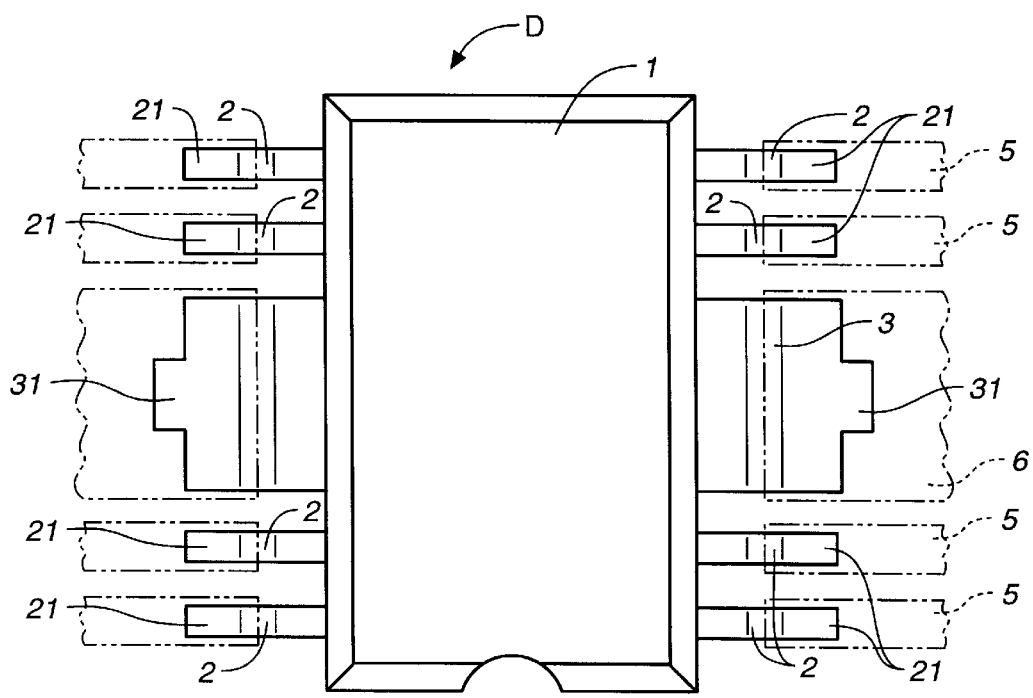
FIG._2

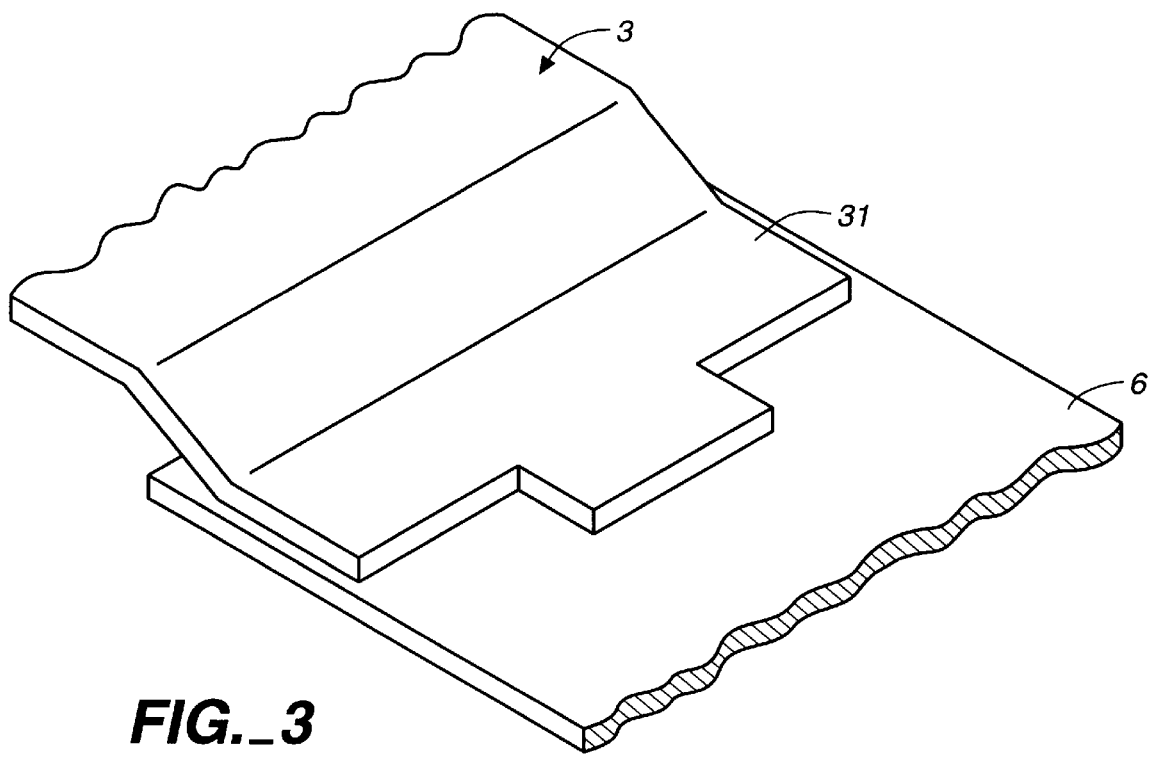
FIG._3
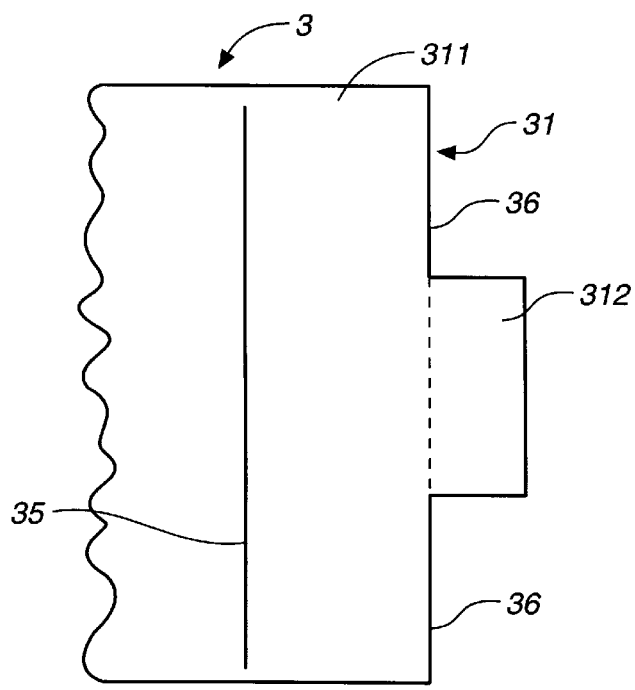
FIG._4

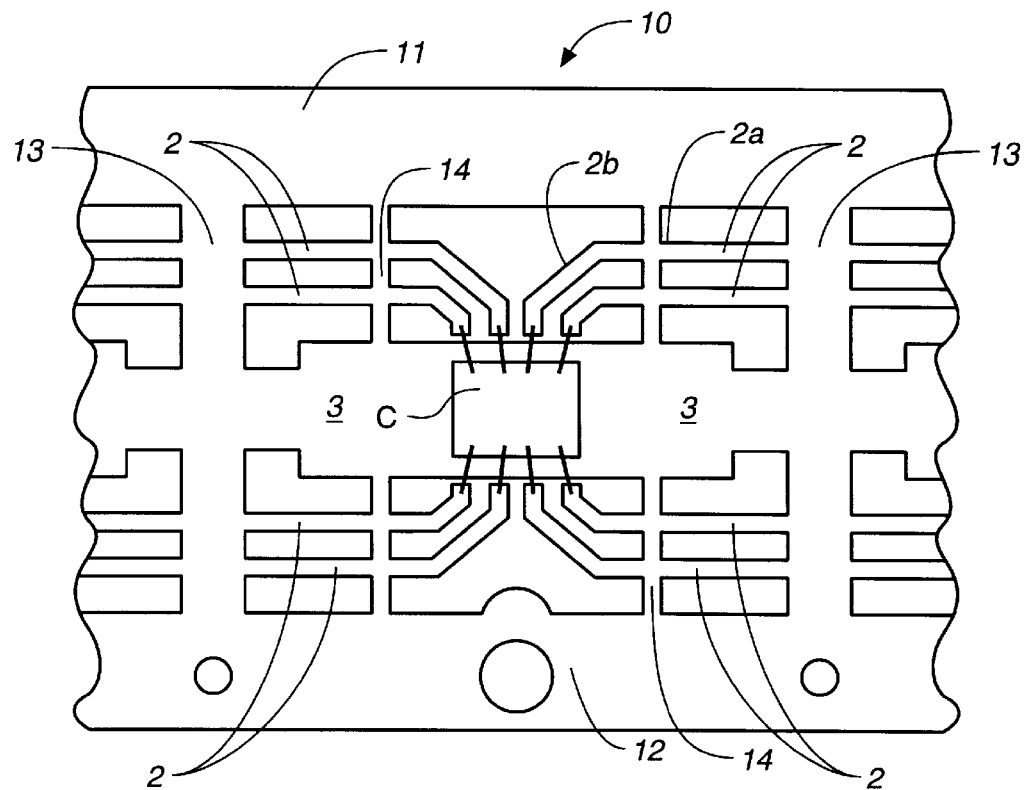
FIG._5
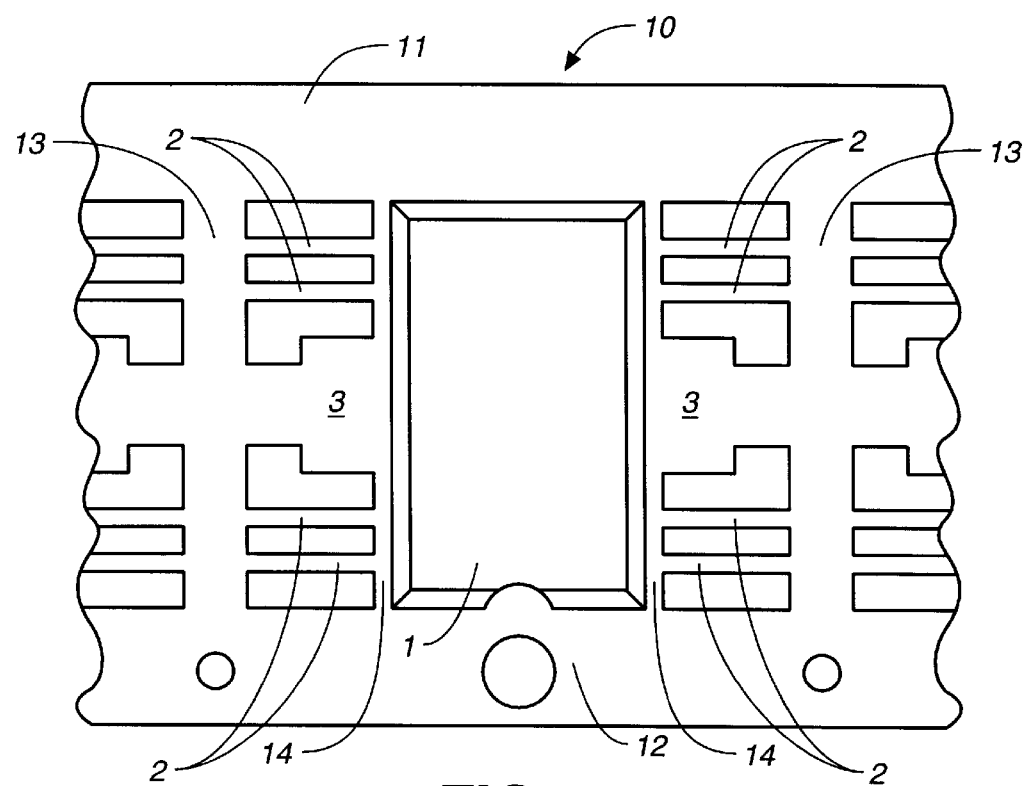
FIG._6

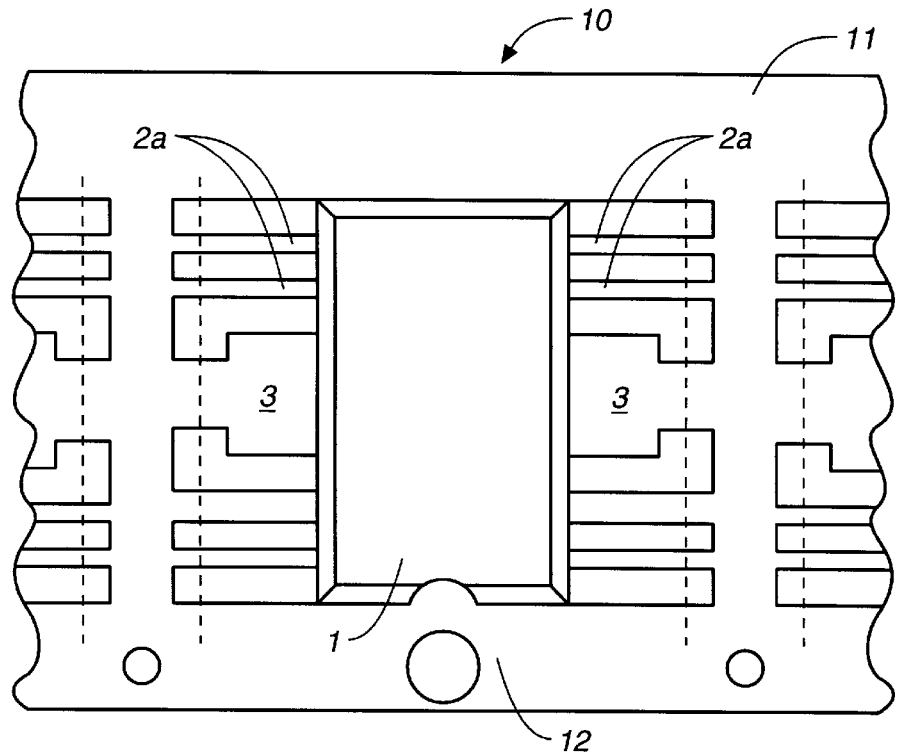
FIG._7
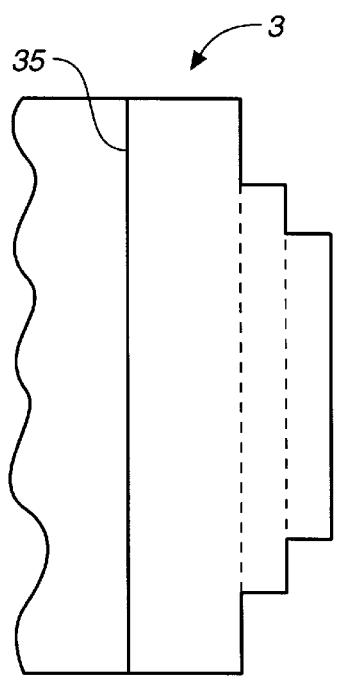
FIG._8
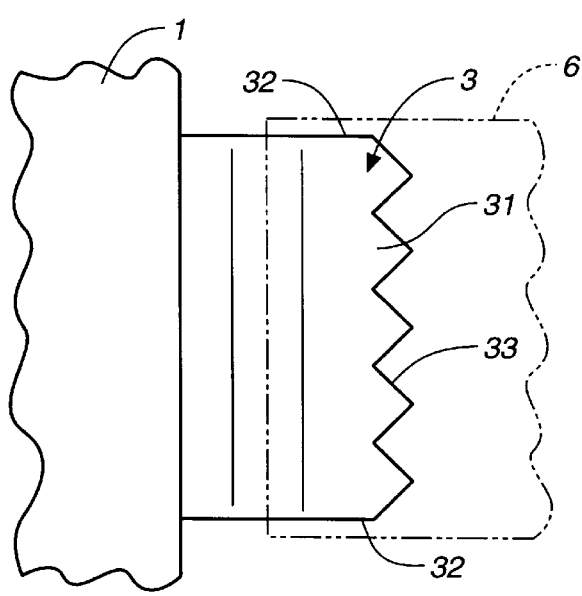
FIG._9

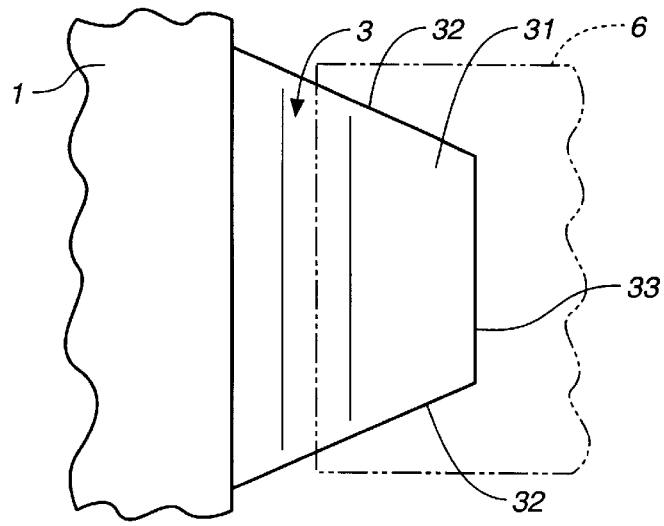
FIG._10
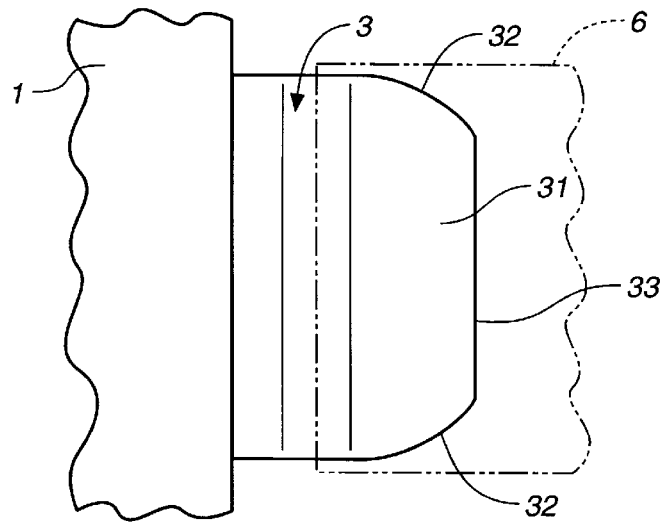
FIG._11
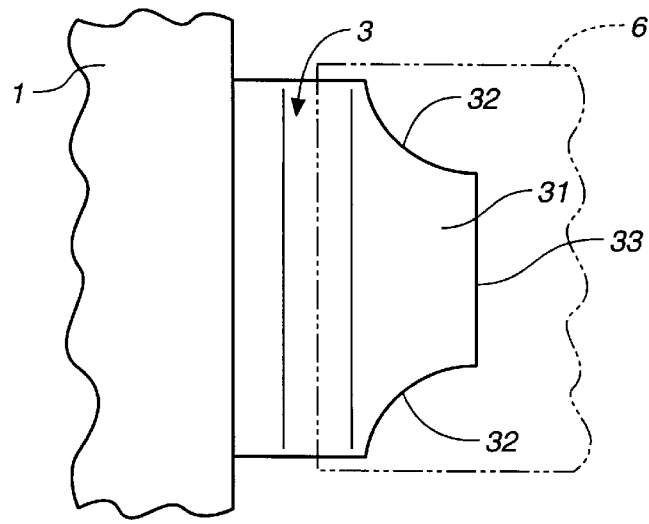
FIG._12

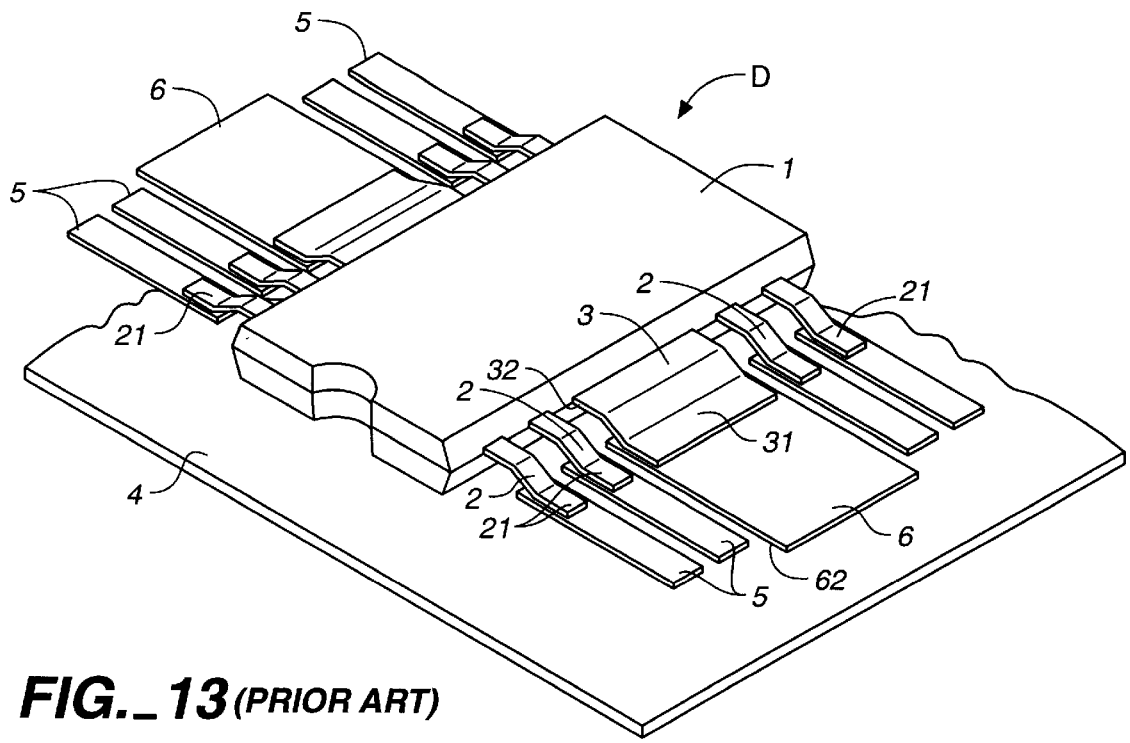
FIG._13 *(PRIOR ART)*
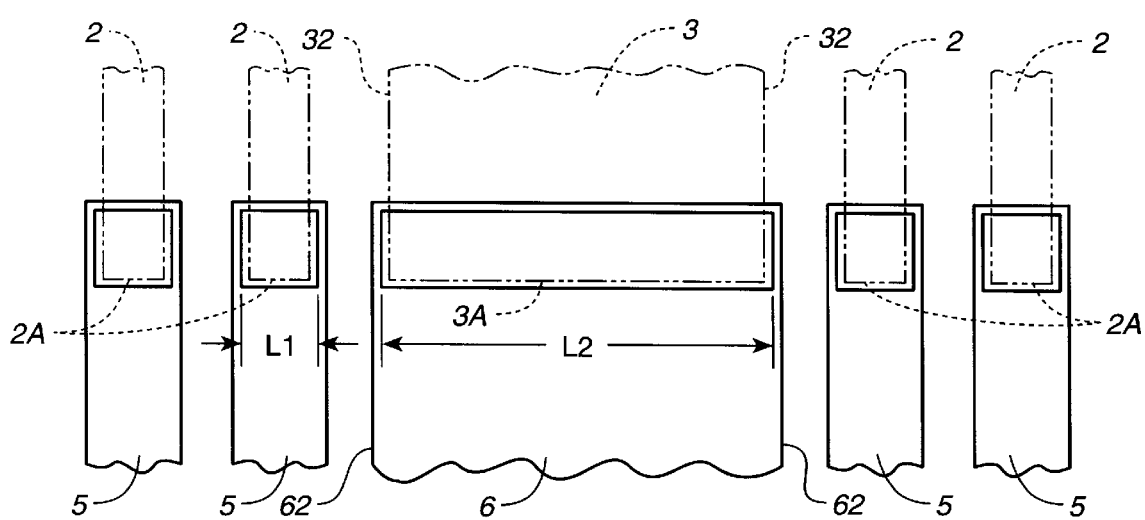
FIG._14 *(PRIOR ART)*

ENCAPSULATED SEMICONDUCTOR DEVICE AND ELECTRONIC CIRCUIT BOARD MOUNTING SAME

BACKGROUND OF THE INVENTION

This invention relates to semiconductor devices of the kind having heat radiating plates and encapsulated in a resin package, as well as electronic circuit boards having such a device mounted thereon.

Among semiconductor devices of the kind containing inside a resin package a semiconductor chip which radiates a large amount of heat during operation such as power ICs, there are those provided with heat radiating plates for efficiently allowing the heat from the semiconductor chip to escape to the exterior. FIG. 13 shows an example of prior art semiconductor device D of this kind structured in a dual in-line form and having lead pins and heat radiating plates in a so-called surface-mountable form. Its resin package 1, containing a semiconductor chip inside, has a specified thickness in the vertical direction and an approximately rectangular shape when seen from above. A plurality of lead pins 2 and a heat radiating plate 3 protrude from each of its two side surfaces, each of the lead pins 2 being connected by wire bonding to a specified one of pads on the semiconductor chip inside the resin package 1, and the heat radiating plate 3 contacting the semiconductor chip inside the resin package 1. The lead pins 2 and the heat radiating plate 3 are each bent into the shape of a crank, having a planar attachment part 21 (also referred to as "the pin-attaching part") or 31 (also referred to as "the plate-attaching part") formed at the outer end (distal from the package 1). Correspondingly, wiring patterns 5 corresponding to the lead pins 2 and heat radiating patterns 6 are formed on a circuit board, say, by pattern-etching a copper foil.

Conventional heat radiating plates were rectangular, having the same width both at the base and at the outer edge. Likewise, heat radiating patterns corresponding to these heat radiating plates were conventionally made in a simple belt-like form having a uniform width matching that of the associated heat radiating plate. In other words, side edges 32 of the heat radiating plate 3 and side edges 62 of the heat radiating pattern 6 were parallel to each other as seen from above, and as shown in FIG. 14.

When an electronic component of a surface mounting type is mounted to a circuit board by a solder reflow method, cream solder is applied first by a printing process on selected portions of the wiring on the circuit board. After the electronic component is positioned on the circuit board, it is introduced into a heating oven. The solvent agent within the cream solder is evaporated, and the solder component is melted to provide electrical connections between the lead pins of the electronic component and the wiring pattern on the circuit board. As the solder is cooled and solidified, a mechanical connection is completed between the lead pins and the pattern.

Suppose this process is carried out for the surface mounting of the prior art semiconductor device D shown in FIG. 13 by soldering. As shown in FIG. 14, cream solder is applied to areas 2A and 3A by printing on each wiring pattern 5 and the heat radiating pattern 6, but the width of the heat radiating pattern 6 is greater than that of the wiring pattern 5, as shown in FIG. 14, because the heat radiating plate 3 is made as wide as possible for improving the heat radiating efficiency while the lead pins 2 are usually made as thin as possible for making the device compact. Thus, the width $L_2$ of the solder-applying area 3A printed on the heat radiating pattern 6 is greater than the width $L_1$ of the solder-applying area 2A printed on the wiring pattern 5.

Let us assume that $L_2$ is four times as great as $L_1$. This means that four times as much cream solder is deposited by printing on the heat radiating pattern 6 than on each of the wiring patterns 5. This, however, does not mean that the total length of the circumference around the cream solder applied in the area 3A on the heat radiating pattern 6 is four times greater than that around the cream solder applied in each of the areas 2A on the wiring patterns 5. In the example shown in FIG. 14, $L_2$ is only about 2.5 times as long as $L_1$, and this causes a problem as follows.

When the semiconductor device D is positioned on the circuit board after cream solder is applied by printing, as described above, and the solder component of the cream solder is melted in a heating oven, the planar attachment parts 21 and 31 of the lead pins 2 and the heat radiating plate 3 compress the melted solder from above due to the weight of the semiconductor device D. This compressive force has the effect of pushing the melted solder out of the space between the attachment parts 21 of the lead pins 2 and the wiring patterns 5 and the space between the planar attachment part 31 of the heat radiating plate 3 and the heat radiating pattern 6. Since the ratio between the amount of the printed solder and the circumferential length around the area printed with solder is greater at the joint for the heat radiating plate 3 than at the joints for the lead pins, relatively more solder will be squeezed out of the printed area on the heat radiating plate 3. As a result, the heat radiating pattern 6 and the adjacent one of the wiring pattern 5 may become shorted by the solder that has been squeezed out. This becomes more likely to occur as the pitch of the lead pins 2 is reduced for producing compact devices.

SUMMARY OF THE INVENTION

The present invention was achieved for the purpose of overcoming the problems as described above, and it is therefore an object of this invention to prevent electrical shorting between the heat radiating plate and the lead pins of a semiconductor device having a semiconductor chip encapsulated inside a resin package when it is surface-mounted by a solder reflow method to a circuit board.

A semiconductor device embodying this invention, with which the above and other objects can be accomplished, may be characterized as comprising a resin package containing a semiconductor chip, lead pins electrically connected to the chip, and a heat radiating plate adapted to transmit heat of the semiconductor chip to the exterior. The lead pins and the heat radiating plate protrude from a side wall of the resin package. The lead pins each have a planar part adapted to be attached by soldering to a wiring pattern on a circuit board, and the heat radiating plate also has a planar attachment part which is adapted to be attached by soldering to a heat radiating pattern on the circuit board. The planar attachment part of the heat radiating plate is non-rectangular and is so shaped that the length of its outer edge connecting its two side edges extending in the direction of extension of the heat radiating plate is longer than if the planar attachment part were rectangular. As an example, the planar attachment part may be of a shape having a smaller rectangular area protruding from one side of a larger rectangle. As another example, it may be nearly rectangular except its outer edge distal from the resin package is in a zigzag shape.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a diagonal view of a semiconductor device encapsulated in a resin package embodying this invention when it is mounted to a circuit board;

FIG. 2 is a plan view of the semiconductor device of FIG. 1;

FIG. 3 is an enlarged view of a portion of FIG. 1 showing the contact between its heat radiating plate and a heat radiating pattern on the circuit board;

FIG. 4 is an enlarged plan view of the planar attachment part of the heat radiating plate of FIG. 3;

FIGS. 5, 6 and 7 are plan views of a frame during various stages of the production process of the semiconductor device of FIG. 1;

FIGS. 8–12 are plan views of the planar attachment parts of other heat radiating plates embodying this invention;

FIG. 13 is a diagonal view of a prior art semiconductor device of a similar type encapsulated in a resin package; and FIG. 14 is a plan view of a portion of the prior art semiconductor device of FIG. 13.

Throughout herein, components which are identical or equivalent and substantially similar to each other are indicated by the same numerals in order to simplify the description and explanation of the invention.

DETAILED DESCRIPTION OF THE INVENTION

Embodiments of the invention are described next with reference to FIGS. 1–12 wherein components which are identical or equivalent and substantially similar to those described above with reference to FIGS. 13 and 14, are indicated by the same numerals and not necessarily described repetitiously.

FIG. 1 shows a so-called dual in-line type semiconductor device D embodying this invention, structured in a surface-mountable form having a resin package 1 having an elongated approximately rectangular shape with a specified thickness. Each of its two longer side surfaces has a plurality of lead pins 2 and a heat radiating plate 3 protruding and longitudinally extending therefrom, each bent in the shape of a crank and provided with a planar attachment part 21 or 31 adapted to be soldered respectively to one of wiring patterns 5 or a heat radiating pattern 6 on a circuit board (not shown in FIG. 1). Inside the package 1, each lead pin 2 is connected by wire bonding to a specified one of pads on a semiconductor chip (shown at C in FIG. 4 but not shown in FIG. 1) to which the heat radiating plate 3 is in contact. The heat radiating plate 3 is for the purpose of allowing heat to escape efficiently from the semiconductor chip C to the exterior, especially in the case of a power IC which generates a large amount of heat during operation. For this purpose, it is made as wide as the circumstances allow, being certainly much wider than the lead pins 2 which are made as thin as possible and of which the pitch is also made as small as technology allows.

The present invention relates in particular to the shape of the heat radiating plate 3, and more in particular, to the shape of the planar part 31 of the heat radiating plate 3. As shown in FIGS. 1, 2 and 3, the planar attachment part 31 of the heat radiating plate 3 according to the first embodiment of this invention is of a shape which may be described in various different ways, but what is important is that it is not a simple rectangle such that the circumferential length around the area is greater than if the planar attachment part 31 were a simple rectangle. As shown more clearly in FIG. 4, the planar shape of the attachment part 31 according to this embodiment of the invention, as seen in a direction perpendicular to its plane, may be described as comprising a wider rectangular part (also referred to as "the connecting part" and indicated by numeral 311 in FIG. 4) and a narrower rectangular part (also referred to as "the protruding part" and indicated by numeral 312 in FIG. 4). The connecting part 311 is proximal to the resin package 1, and heat from the semiconductor chip inside the resin package 1 is adapted to flow to the planar part 31 across one of its four edges (referred to as "the connecting edge" and indicated by numeral 35 in FIG. 4). For the convenience of reference, the edge of the rectangular shape of the connecting part 311 opposite the connecting edge 35 is hereafter referred to as "the opposite edge" and indicated by numeral 36 in FIG. 4. The protruding part 312 is also rectangular and is connected to the connecting part 311 such that it may appear to be protruding therefrom across its "opposite edge" 36. Although expressions such as "protruding" and "connecting" have been used in describing the planar shape of the attachment part 31 of the heat radiating plate 3, it is to be understood that they were used only for the purpose of describing the geometrical shape. Structurally, it should be understood, as shown in FIGS. 1 and 3, that the connecting part 311 and the protruding part 312 are mutually connected portions of one single continuous material which forms the whole of the heat radiating plate 3.

The heat radiating pattern 6 is formed on the circuit board in a belt-like shape with a uniform width which is equal to the maximum width of the heat radiating plate 3. Besides the heat radiating pattern 6, various wiring patterns 5 to be connected to the attachment parts 21 of the lead pins 2 are also formed on the same circuit board, say, by a known technology for the production of printed circuit boards such as comprising the steps of forming a foil of a conductive metal such as copper on the surface of a board material such as glass epoxy and removing unwanted portions of the foil by a pattern etching process. The heat radiating pattern 6 is not prevented from serving also as a grounding line.

The mounting of the semiconductor device D described above to a circuit board is effected by a so-called solder reflow method. Cream solder is applied by a printing method to end areas of the wiring patterns 5 and the heat radiating pattern 6, and the semiconductor device D is placed on the board such that the planar attachment parts 21 and 31 of its lead pins 2 and the heat radiating plate 3 are placed on these solder-coated areas of the patterns 5 and 6. With the device D thus positioned on the circuit board, the loaded board is placed inside a heating furnace to be heated for a specified length of time and then cooled.

When thus heated, the solvent component of the cream solder is evaporated while the solder portion becomes melted and is spread through the spaces between the planar parts 21 and 31 and the patterns 5 and 6. During this process, the melted solder tends to be squeezed out of these spaces due to the weight of the semiconductor device D. Since the heat radiating plate 3 is much wider than the lead pins 2, as explained above, more solder tends to be squeezed out through the circumference of the planar attachment part 31 of the heat radiating plate 3. Because the attachment part 31 of the heat radiating plate 3 is not of a simple rectangular shape, there being a protrusion which increases the total length of the circumference of the attachment part 31, the melted solder can be effectively prevented from flowing out, being kept on the heat radiating pattern 6 along the edge line of the attachment part 31. This means that the problem of shorting through the melted solder between the patterns and the planar attachment parts 21 and 31 can be effectively overcome.

Next, a method of producing such a semiconductor device D structured as described above will be explained with reference to FIGS. 5, 6 and 7. For the production of semiconductor devices of the type described above, use is generally made of a production frame 10 commonly known as a lead frame. As shown in FIG. 5, cross frames 13 are formed between the left-hand and right-hand side frames 11 and 12 with a specified interval in the longitudinal direction between them. The space surrounded by a mutually adjacent pair of these cross frames 13 as well as the side frames 11 and 12 represents one section on which a heat radiating plate 3 and a plurality of lead pins 2 are formed. Parts of the lead pins 2 where these lead pins 2 are each divided into its outer part 2a and inner part 2b are mutually connected by tie bars 14 which are also connected to a middle part of the heat radiating plate 3.

While the production frame 10 thus formed is moved longitudinally, a semiconductor device D is bonded at the center of the heat radiating plate 3 of each section and the pads on the upper surface of this semiconductor device D are connected to individual ones of the inner parts 2b of the lead pins 2 by wire bonding.

Next, as shown in FIG. 6, a resin package 1 is formed on the rectangular area surrounded by the inner edges of the side frames 11 and 12 and the inner edges of the tie bars 14 by means of a molding apparatus having a cavity with a suitable shape. Next, the unwanted portions of the tie bars 14 are removed, say, by punching out, as shown in FIG. 7, such that the individual lead pins 2 and the heat radiating plate 3 are mutually separated. The outer parts 2a of the lead pins 2 and the heat radiating plate 3 are subsequently cut as shown by broken lines in FIG. 7. Finally, the outer parts 2a of the lead pins 2 and the heat radiating plate 3 are bent as shown in FIG. 1 to complete the production.

The semiconductor device D encapsulated in a resin package embodying this invention can be distinctively characterized by the shape of its heat radiating plate 3 and, in particular, by that of its planar attachment part 31. As can be seen in FIGS. 5–7, the shape of the planar attachment part 31 of the heat radiating plate 3 can be selected already at the stage of preparing the production frame 10. In other words, the present invention can be practiced easily by effecting a simple change on the mold for the production of the production frame 10.

FIGS. 8–12 show heat radiating plates with planar attachment parts shaped differently. The shape shown in FIG. 8 is similar to the one described above in FIG. 4 except another rectangular part with a still smaller width protrudes from what was referred to as "the protruding part" with reference to FIG. 4. The shape of the attachment part 31 shown in FIG. 8, as well as that shown in FIG. 4, may be alternatively characterized by saying that the width decreases in a stepwise manner, there being only one such stepwise decrease in the case of FIG. 4 and two in the case of FIG. 8. The number of such stepwise changes in width does not limit the scope of this invention.

FIG. 9 shows the shape of the planar attachment part 31 of still another heat radiating plate 3 according to another embodiment of this invention, characterized in that its end edge 33 connecting its two longitudinally extending side edges 32 is a zigzag line. The zigzag line has the effect of increasing the total length of the end edge section 33, making it greater than the width of the attachment part 31 (or the distance between the side edges 32), such that melted solder at the time of the mounting process can be more easily prevented from flowing out.

The example shown in FIG. 10 is characterized in that the entire heat radiating plate 3 is trapezoidal shaped, its width decreasing not only monotonically but also uniformly towards the end edge 33. By this example, too, the sloped side edges 32 make the total length of the circumference of the attachment part 31 greater than if it were rectangular and thus can effectively keep the melted solder from flowing out at the time of mounting.

The example shown in FIG. 11 is characterized as having outwardly convex arcuate side edges 32 reaching a straight end edge 33. The example shown in FIG. 12 is characterized in that the side edges 32 are sloped to be externally concave, reducing its width monotonically towards the end edge 33. At the time of a solder reflow process, the melted solder can be kept on the attachment part 31 along these arcuate side edges 32 such that shorting with the neighboring lead pins through melted solder can be prevented.

The invention is not intended to be limited by these examples. Many changes in design are possible within the scope of this invention. Although embodiments with heat radiating plates protruding from both side surfaces have been illustrated, only one heat radiating plate may be used, protruding from only one of the side surfaces. All such modifications and variations that may be apparent to a person skilled in the art are intended to be within the scope of this invention.

What is claimed is:

1. An electronic circuit board comprising:

a circuit board having a wiring pattern and a heat radiating pattern thereon; and a semiconductor device mounted to said circuit board, said semiconductor device comprising a resin package containing a semiconductor chip, lead pins electrically connected to said semiconductor chip, and a heat radiating plate which is substantially wider than said lead pins for transmitting out heat of said semiconductor chip, said lead pins protruding from a side wall of said resin package, said lead pins each having a planar pin-attaching part attached by soldering to said wiring pattern, said heat radiating plate extending in a longitudinal direction away from said resin package and being bent so as to provide a planar plate-attaching part, said heat radiating plate being attached by soldering to said heat radiating pattern on said circuit board only through said plate-attaching part, said plate-attaching part having a width which keeps decreasing without remaining the same in any portion thereof in said longitudinal direction.

2. The electronic circuit board of claim 1 said plate-attaching part is trapezoidal, whereby said width decreases uniformly.

3. The electronic circuit board of claim 1 wherein said plate-attaching part has arcuate side edges.

4. A semiconductor device comprising:

a resin package containing a semiconductor chip;

pins electrically connected to said semiconductor chip; and a heat radiating plate which is substantially wider than said lead pins for transmitting out heat of said semiconductor chip;

said lead pins protruding from a side wall of said resin package, said lead pins each having a planar pin-attaching part adapted to be attached by soldering to a wiring pattern on a circuit board, said heat radiating plate extending in a longitudinal direction away from said resin package and being bent so as to provide a planar plate-attaching part, said heat radiating plate serving to be attached by soldering to a heat radiating pattern on said circuit board only through said plate-attaching part, said plate-attaching part having a width which keeps decreasing without remaining the same in any portion thereof in said longitudinal direction.

5. The semiconductor device of claim 4 wherein said plate-attaching part is trapezoidal, whereby said width decreases uniformly.

6. The semiconductor device of claim 4 wherein said plate-attaching part has arcuate side edges.

\* \* \* \* \*